United States Patent
Jandt et al.

(10) Patent No.: US 9,383,733 B1
(45) Date of Patent: Jul. 5, 2016

(54) DYNAMIC POSITION CONTROL FOR ELECTRONIC COMPONENTS

(71) Applicant: International Business Machines Corporation, Armonk, NY (US)

(72) Inventors: Tyler Jandt, Rochester, MN (US); Phillip V. Mann, Rochester, MN (US); Mark D. Plucinski, Rochester, MN (US); Sandra J. Shirk/Heath, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/974,051

(22) Filed: Dec. 18, 2015

Related U.S. Application Data

(63) Continuation of application No. 14/876,970, filed on Oct. 7, 2015.

(51) Int. Cl.
  *H02P 6/16* (2016.01)
  *G05B 11/01* (2006.01)
  *G05B 1/04* (2006.01)

(52) U.S. Cl.
  CPC ............... *G05B 11/011* (2013.01); *G05B 1/04* (2013.01)

(58) Field of Classification Search
  CPC ............. H01L 41/0986; H01L 41/047; H01L 41/0478; H02N 2/101; H04R 19/02
  See application file for complete search history.

(56) References Cited

U.S. PATENT DOCUMENTS

| | | | |
|---|---|---|---|
| 6,184,609 B1 | 2/2001 | Johansson et al. | |
| 7,352,284 B2 | 4/2008 | Krill | |
| 7,521,847 B2 | 4/2009 | Heim | |
| 8,133,199 B2 * | 3/2012 | Weber | A61B 1/00082 604/100.01 |
| 8,517,963 B2 | 8/2013 | Larson et al. | |
| 8,953,332 B2 | 2/2015 | Canfield et al. | |
| 2010/0253617 A1 * | 10/2010 | Iio | G06F 3/03548 345/156 |
| 2010/0254837 A1 | 10/2010 | Boersma et al. | |
| 2010/0332035 A1 * | 12/2010 | Gao | G05B 9/02 700/275 |
| 2013/0192910 A1 | 8/2013 | Sayre et al. | |
| 2013/0252456 A1 | 9/2013 | Kuczynski et al. | |
| 2014/0240108 A1 | 8/2014 | Matthews | |

(Continued)

FOREIGN PATENT DOCUMENTS

| | | |
|---|---|---|
| WO | 03061107 A2 | 7/2003 |
| WO | 2015128173 A1 | 9/2015 |

OTHER PUBLICATIONS

Jandt et al., "Dynamic Position Control for Electronic Components," U.S. Appl. No. 14/876,970, filed Oct. 7, 2015.

(Continued)

*Primary Examiner* — Shawki S Ismail
*Assistant Examiner* — Zoheb Imtiaz
(74) *Attorney, Agent, or Firm* — Robert J. Shatto; Robert Williams

(57) ABSTRACT

A computer system may determine a target position of the electronic component. The computer system may also determine a current position of the electronic component. The computer system may compare the current position to the target to position to determine whether the electronic component is in the target position. If the electronic component is not in the target position, the computer system may use an electroactive polymer to adjust the position of the electronic component to move the electronic component into the target position.

1 Claim, 7 Drawing Sheets

(56) References Cited

U.S. PATENT DOCUMENTS

2015/0043095 A1    2/2015  Lipton et al.
2015/0317552 A1*  11/2015  Ishida .................. A63F 1/02
                                              235/375

OTHER PUBLICATIONS

List of IBM Patents or Patent Publications Treated as Related dated Feb. 9, 2016, 2 pages.

* cited by examiner

DYNAMIC POSITION CONTROL FOR ELECTRONIC COMPONENTS

CROSS REFERENCE TO RELATED APPLICATION

This application claims priority to U.S. patent application Ser. No. 14/876,970, filed Oct. 7, 2015, which is incorporated herein in its entirety.

BACKGROUND

The present disclosure relates generally to the field of electronic components, and more particularly to dynamically adjusting the position of electronic components.

Electronics enclosures, such as those used in computer systems, often contain numerous electronic components, such as video cards and sound cards. Typical methods for retention of the electronic components in the electronics enclosure involve large loading hardware and non-influencing fasteners. These devices typically have one or two positions (e.g., an undocked and docked position) that require manual operation. Additionally, expensive and disposable shipping brackets are often used to mitigate connector wear when the enclosure is shipped.

SUMMARY

Embodiments of the present invention disclose a method, computer program product, and system for adjusting a position of an electronic component. A computer system may determine a target position of the electronic component. The computer system may also determine a current position of the electronic component. The computer system may determine whether the electronic component is in the target position by comparing the current position to the target position. If the electronic component is not in the target position, the computer system may use an electroactive polymer to adjust the position of the electronic component to move the electronic component into the target position.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1A:
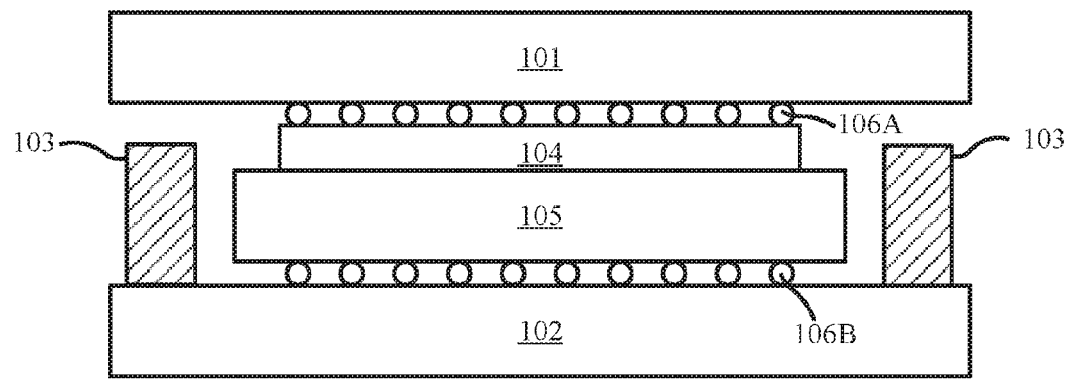
FIGS. 1A-C illustrate an exemplary pair of electronic components having electroactive polymers (EAPs) to dynamically adjust the position of the electronic components, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronic components, and more particularly to dynamically adjusting the position of electronic components. While the present disclosure is not necessarily limited to such applications, various aspects of the disclosure may be appreciated through a discussion of various examples using this context.

Computer systems often contain numerous electronic components, such as video cards and sound cards, mounted in an electronics enclosure. These computer systems are often shipped fully assembled in their electronics enclosure. The numerous electronic components in the computer system must be securely retained within the electronics enclosure to ensure that they are protected during shipping. These components are stationary and typically are shipped in one of two shipping positions (e.g., an undocked position or a docked position) to protect the electronic components during shipping.

The electronic components may be manually placed in their shipping position and, upon arrival, may be properly set up for normal operation. For example, an electronic component that is shipped in an undocked position will need to be docked (i.e., connected) in order for the computer system to properly operate. In order to protect the electronic components during shipping, and to ensure that they stay in their docked or undocked shipping position, expensive and disposable shipping brackets are often used.

The "position" of an electronic component (also referred to as the height of the electronic component) may refer to the location of the electronic component relative to a complementary component. The complementary component may be an electronic component that is configured to be coupled with the electronic component using a connector (e.g., a Molex connector) as part of its normal operation.

A shipper may wish to automatically arrange the electronic components in their proper shipping position without the need for manual intervention. He may also wish to have the electronic components automatically return to their operating position when the system is powered on by the recipient without the recipient having to manually reconnect the electronic components. In order to minimize the amount of time spent repositioning the electronic components, a computer system may determine the target position (also referred herein as the target height) of one or more internal electronic components and automatically reposition the components accordingly. The electronic components may include electroactive polymers (EAPs), which are polymers that exhibit a change in size or shape when stimulated by an electric field.

The EAPs may be any type of EAP, including dielectric or ionic EAPs. Dielectric EAPs include, but are not limited to, ferroelectric polymers (e.g., polyvinylidene fluoride), electrostrictive graft polymers, and liquid crystalline polymers. Ionic EAPs include, but are not limited to, ionic polymer-metal composites, electrorheological fluids, and stimuli-responsive gels. The EAPs may be situated on one or more complementary electronic components (e.g., electronic components that are configured to be electrically connected with each other) such that the EAPs will cause the complementary electronic components to move relative to each other when the EAPs are stimulated with a voltage.

In some embodiments, a user may input the target position of one or more electronic components. The user may select from a number of predetermined positions, such as an over-docked shipping position, an undocked shipping position, and an operating position. Each predetermined position may have an associated voltage that causes the electronic component to move to the predetermined position. After the user selects the target position, the computer system may apply the associated voltage to the EAPs to move the electronic component into the target position.

In some embodiments, the user may input the target EAP voltage (e.g., the voltage that the user wishes to apply to the EAPs). The computer system may then determine (e.g., measure) the actual EAP voltage (e.g., the voltage that is currently being applied to the EAPs). The computer system may compare the target EAP voltage to the actual EAP voltage to determine whether the electronic component is in the correct position. In some embodiments, the computer system may determine that the electronic component is in the correct position if the difference between the actual EAP voltage and the target EAP voltage is within a threshold. If the computer system determines that the electronic component is not in the correct position, the computer system may adjust the voltage applied to the EAPs.

In some embodiments, the EAPs may be a part of an electrical connector. The electrical connector may be communicatively coupled with an electronic component using, e.g., a ball grid array solder joint. The EAPs may make up part of the connector housing such that the EAPs are configured to adjust the position of the electrical connector (and/or the electronic component attached to the connector) relative to a complementary electrical connector or electronic component. For example, the walls of the connector body of an electrical connector may expand as a voltage is applied to EAPs in the connector body. The walls may expand in a direction towards a complementary electrical connector. The expanding walls may cause the electrical connector to lose its electrical coupling with the complementary electrical connector. When the voltage is removed from the EAPs, the walls may contract, causing the electrical connector and the complementary electrical connector to reconnect. Another example configuration of EAPs in a connector body is discussed more thoroughly in reference to FIGS. 4A-C.

In various embodiments, the electrical connector that includes the EAPs may be attached to a cable (e.g., a power cable). For the purposes of these embodiments, the cable may be considered the electronic component to which the electrical connector is coupled. The cable may be, e.g., a panel mounted cable that mounts to a panel of an electronics enclosure. In cases where the cable is a panel mounted cable, the EAPs may cause the electrical connector (in particular, the electrical contacts of the electrical connector) to move relative to the panel or relative to a corresponding connector. This may cause the electrical connector to dock or undock with the corresponding connector.

For example, the panel mounted connector may be a male connector (e.g., a male power connector) that has a corresponding female connector. The connectors may be attached to power cables and the male connector may include EAPs. When the EAPs are not powered, the male and female connectors may be electrically coupled (e.g., docked). When a voltage is applied to the EAPs, the EAPs may expand and cause the male connector to move away from the panel, thereby undocking it from the female connector. In some embodiments, the expanding EAPs may instead push the female connector away from the panel, undocking it from the male connector.

Figure 1B:
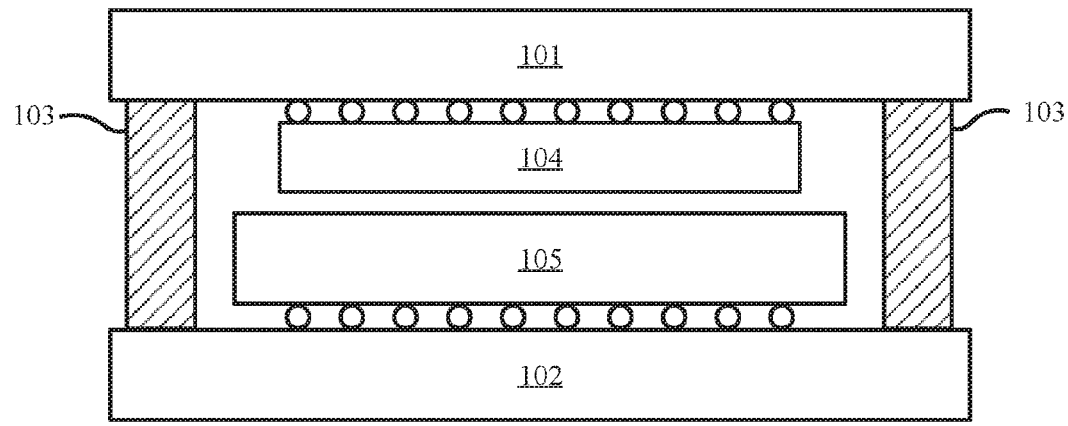
Figure 1C:
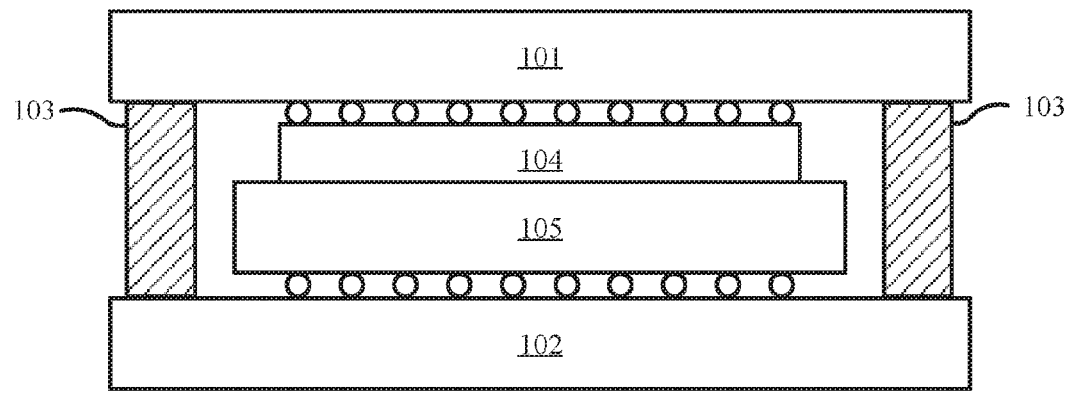

Turning now to the Figures, FIGS. 1A-C illustrate an exemplary pair of electronic components having electroactive polymers (EAPs) to dynamically adjust the position of the electronic components, in accordance with embodiments of the present disclosure. FIG. 1A illustrates two electronic components 101, 102 in an over-docked shipping position. The first electronic component 101 is coupled with a first connector 104 using a ball grid array (BGA) solder joint 106A. The second electronic component 102 is coupled with a second connector 105 using a BGA solder joint 106B. The first connector 104 and the second connector 105 are electrical connectors that are configured for joining the first electronic component 101 and the second electronic component 102. The first and second connectors 104, 105 may be any type of electrical connectors including, but not limited to, Video Graphics Array (VGA) connectors, serial port connectors, Accelerated Graphics Port (AGP) connectors, Peripheral Component Interconnect (PCI) connectors, and Molex connectors.

The electronic components 101, 102 may be any type of computer hardware that is configured to be coupled with another electronic component through an electrical connector. For example, the electronic components 101, 102 may include, but are not limited to, hard disk drives (HDD), solid state drives (SSD), graphics cards, sound cards, memory (such as DIMMs), optical disc drives, cables (e.g., power cables or Ethernet cables) and expansion cards. The electronic components may also be other computer chips including integrated circuits (ICs), such as application specific integrated circuits (ASICs), on a printed circuit board (PCB). While the electronic components 101, 102 are shown as being attached to their respective connectors 104, 105 via BGA joints 106A and 106B, respectively, any other means for attaching the connectors to the electronic components that is otherwise consistent with this disclosure is contemplated. For example, the connectors 104, 105 may be attached to the electronic components 101, 102 using any surface-mount technology (SMT) or through-hole technology. In some embodiments, the connectors 104, 105 may be attached to a cable, such as a panel mounted cable, instead of soldered to a PCB as shown in FIG. 1A.

The electronic components 101, 102 shown in FIG. 1A are in an over-docked shipping position. In this position, the connectors 104, 105 may be forced together by a load (e.g., from gravity or mechanical forces) that exceeds the desired force on the connectors during operation of the computer system. In some embodiments, the load used to over-dock the electronic components 101, 102 may be sustained throughout the shipping process. In other embodiments, the load used to over-dock the electronic components 101, 102 may be applied to initially connect the electronic components and then be removed such that residual stresses are responsible for holding the electronic components in the over-docked position.

The second electronic component 102 also includes two EAPs 103. The EAPs sit on the top surface of the second electronic component 102 (i.e., on the surface facing the first electronic component 101). The EAPs 103 may be oriented such that they expand towards the first electronic component 101 when a voltage is applied to the EAPs. While the Figures show embodiments of the present disclosure where the electronic components include two distinct EAPs, any number of EAPs may be used. For example, in some embodiments a single EAP may be used to adjust the position of an electronic component. In other embodiments, such as where the electronic component is large and/or the footprint of individual EAPs on the electronic component must be relatively small, more than 2 EAPs may be used to adjust the position of the electronic component.

In some embodiments, the EAPs 103 may be in a retracted position such that they do not make contact with the first electronic component 101 when the electronic components 101, 102 are in an over-docked shipping position, as shown in FIG. 1A. In other embodiments, the EAPs 103 may be configured to touch the first electronic component 101, even in the over-docked position. In these embodiments, the EAPs 103 may not provide significant upward force on the first electronic component 101 (e.g., force causing the connectors 104, 105 to become disconnected) so that the electronic components 101, 102 remain in the over-docked position.

FIG. 1B illustrates the two electronic components 101, 102 in a second shipping position. In this shipping position, the electronic components 101, 102 are in an undocked position. A voltage may be applied to the EAPs 103 causing them to expand towards the first electronic component 101. The expanding EAPs 103 may cause the first electronic component 101 to become disconnected from the second electronic component 102 by undocking the first and second connectors 104, 105. In some embodiments, the amount of expansion of the EAPs 103, and therefore the distance between the electronic components 101, 102, may be adjusted by adjusting the voltage that is applied to the EAPs. For example, in some embodiments the electronic components 101, 102 may be separated by a larger amount by applying a greater voltage to the EAPs 103.

FIG. 1C illustrates the two electronic components 101, 102 in an operating position. In the operating position, the electronic components 101, 102 are in a docked, but not over-docked, position relative to each other. A voltage may be applied to the EAPs 103 such that the EAPs are partially expanded. The EAPs 103 may make contact with the first electronic component 101 such that the first electronic component is held at a target height with respect to the second electronic component 102. In the operating position, the target height may cause the connectors 104, 105 to be securely connected such that pins inside the connector make an electrical contact without causing excessive wear or damage to the pins. Accordingly, the operating position may provide superior pin wipe and prevent BGA fatigue (such as BGA creep) when compared to an over-docked position.

In some embodiments, an appropriate voltage may be applied to the EAPs 103 in response to a user's input. For example, a user may indicate that the computer system is to be put into the first (e.g., over-docked) shipping position as a part of a computer shutdown process. Accordingly, the voltage may be removed from the EAPs causing the EAPs to retract as shown in FIG. 1A. External forces, such as gravity or mechanical forces (e.g., from mounting brackets or springs) on the electronic components 101, 102 may move the electronic components together. The electronic components 101, 102 may therefore be placed in an over-docked position for shipping. In some embodiments, the EAPs 103 may be connected to the first electronic components such that the retracting EAPs pull the first electronic component into the over-docked position. When the computer is subsequently powered on, a voltage may be applied to the EAPs 103 to move the electronic components 101, 102 into the operating position shown in FIG. 1C.

As another example, a voltage may be applied to the EAPs 103 in response to a user indicating that the computer system is to be put into the second (e.g., undocked) shipping position as a part of a computer shutdown process. The voltage may cause the EAPs 103 to expand such that the electronic components 101, 102 are in the undocked shipping position shown in FIG. 1B. When the computer is subsequently powered on, the voltage to the EAPs 103 may be lowered to cause the EAPs to retract, moving the electronic components 101, 102 into their operating position shown in FIG. 1C.

In some embodiments, the EAPs 103 may receive power from the electronic component(s) to which they are connected. For example, the EAPs 103 may receive power through their connection to the second electronic component 102. In other embodiments, the EAPs may be powered by a discrete connection, such as a wire dedicated to providing power to the EAPs. In some embodiments, particularly when a voltage must be applied to the EAPs 103 to keep the electronic components 101, 102 in the appropriate position during shipping (e.g., as shown in FIG. 1B), the EAPs power may not depend on the computer system's power state. In other words, the EAPs may receive power from the enclosure (e.g., from a battery, capacitor, or other power supply coupled with the EAPs) even when the computer system is powered off.

Figure 2A:
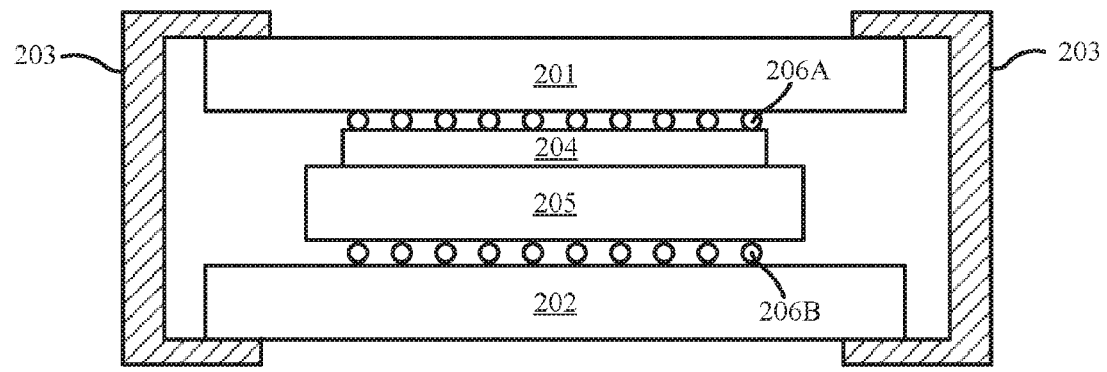
FIGS. 2A-C illustrate another exemplary pair of electronic components having EAPs to dynamically adjust the position of the electronic components, in accordance with embodiments of the present disclosure.
Figure 2B:
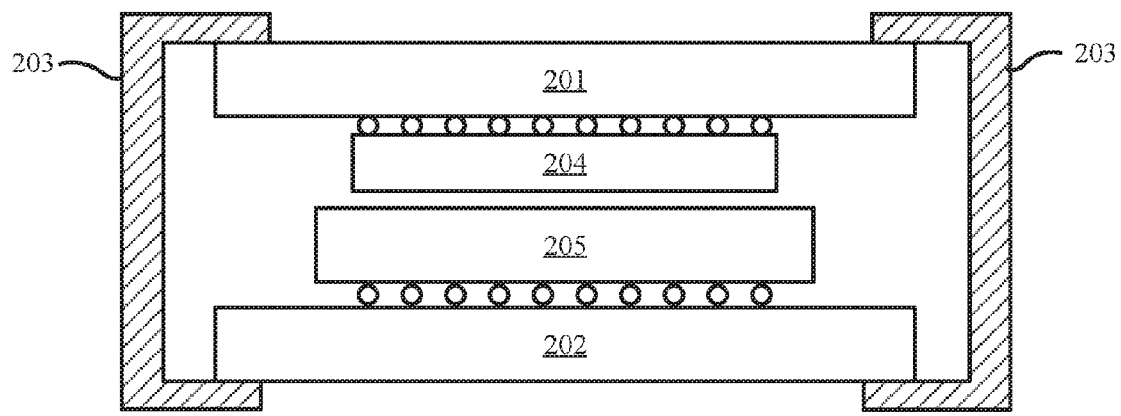
Figure 2C:
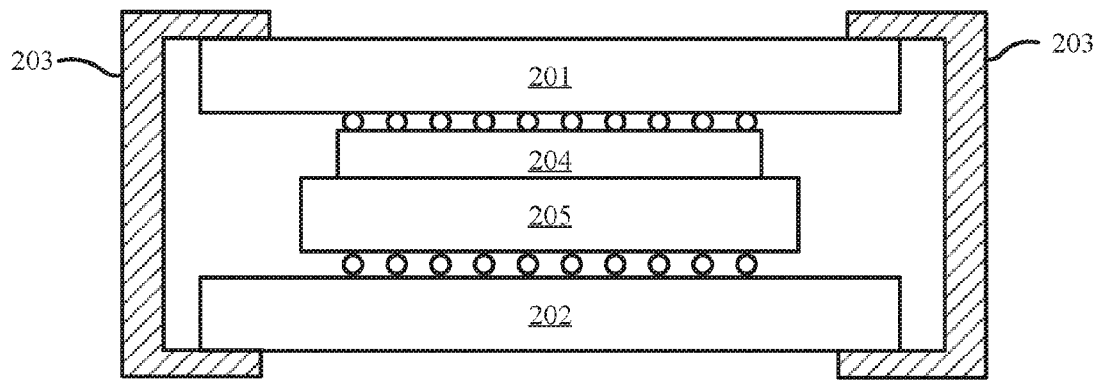

Referring now to FIGS. 2A-C, shown is another exemplary pair of electronic components having EAPs to dynamically adjust the position of the electronic components, in accordance with embodiments of the present disclosure. FIG. 2A illustrates two electronic components 201, 202 in an over-docked shipping position. The first electronic component 201 is coupled with a first connector 204 using a BGA solder joint 206A. The second electronic component 202 is coupled with a second connector 205 using a BGA solder joint 206B. The first connector 204 and the second connector 205 are electrical connectors that are configured for coupling the first electronic component 201 and the second electronic component 202 together. The first and second connectors 204, 205 may be any type of electrical connectors including, but not limited to, VGA connectors, serial port connectors, AGP connectors, PCI connectors, and Molex connectors.

The electronic components 201, 202 may be any type of computer hardware that is configured to be coupled with another electronic component through an electrical connector, such as those discussed in reference to FIG. 1A. While the electronic components 201, 202 are shown as being attached to their respective connectors 204, 205 via BGA joints 206A and 206B, respectively, any other means for attaching the connectors to the electronic components that is otherwise consistent with this disclosure is contemplated, as discussed in reference to FIG. 1A.

The electronic components 201, 202 shown in FIG. 2A are in an over-docked shipping position. In this position, the connectors 204, 205 may be forced together by the EAPs 203. The load applied to the electronic components 201, 202 by the EAPs 203 may exceed the desired force on the connectors during operation. In some embodiments, the load used to over-dock the electronic components 201, 202 may be sustained throughout the shipping process. In other embodiments, the load used to over-dock the electronic components 201, 202 may be applied by the EAPs to initially connect the electronic components and then the load may be removed such that residual stresses are responsible for holding the electronic components in the over-docked position.

EAPs 203 may be attached to the electronic components 201, 202 in order to adjust the position of the electronic components relative to each other. The EAPs 203 may be connected to the top surface of the first electronic component 201 (i.e., to the surface opposite the first connector 204 and the second electronic component 202) and to the bottom surface of the second electronic component (i.e., to the surface opposite the second connector 205 and the first electronic component 201). The EAPs 203 may be attached to the electronic components 201, 202 using any appropriate bonding method including, e.g., using an epoxy bond. In some embodiments, the EAPs 203 may be held in place through mechanical resistive forces, such as frictional forces. The EAPs 203 may be oriented such that their expansion, when a voltage is applied, causes them to pull the electronic components 201, 202 away from each other. Likewise, the EAPs 203 may move the electronic components 201, 202 together when contracting. In other embodiments, the EAPs 203 may contract when a voltage is applied, causing the electronic components 201, 202 to move closer to each other, ultimately docking with one another. Likewise, the EAPs 203 may expand or relax when the voltage is removed, causing the electronic components 201, 202 to separate and disengage or undock.

FIG. 2B illustrates the two electronic components 201, 202 in a second shipping position. In this shipping position, the electronic components 201, 202 are in an undocked position. A voltage may be applied to the EAPs 203, causing them to expand. The expanding EAPs 203 may cause the first electronic component 201 to become disconnected from the second electronic component 202 by undocking the first and second connectors 204, 205. In some embodiments, the amount of expansion of the EAPs 203, and therefore the distance between the electronic components 201, 202, may be adjusted by adjusting a voltage that is applied to the EAPs. For example, in some embodiments the electronic components 201, 202 can be separated by a larger amount by applying a greater voltage to the EAPs 203.

FIG. 2C illustrates the two electronic components 201, 202 in an operating position. In the operating position, the electronic components 201, 202 are in a docked, but not over-docked, position. A voltage may be applied to the EAPs 203 such that the EAPs are partially expanded. The amount of expansion of the EAPs 203 may cause the first electronic component 201 to be held at a target height with respect to the second electronic component 202. In the operating position, the target height may cause the connectors 204, 205 to be securely connected such that pins inside the connector make an electrical contact without causing excessive wear or damage to the pins. Accordingly, the operating position may provide superior pin wipe and prevent BGA fatigue (such as BGA creep) when compared to the over-docked position.

In some embodiments, an appropriate voltage may be applied to the EAPs 203 in response to a user's input. For example, a user may indicate that the computer system is to be put into the first shipping position as a part of a computer shutdown process. Accordingly, voltage may be removed from the EAPs causing the EAPs to contract, pulling the electronic components 201, 202 together. This may result in the coupling of the connector 204, 205, as shown in FIG. 2A.

The electronic components 201, 202 may therefore be placed in an over-docked position for shipping. When the computer system is subsequently powered on, a voltage may be applied to the EAPs 203 to move the electronic components 201, 202 into the operating position shown in FIG. 2C.

As another example, a voltage may be applied to the EAPs 203 in response to a user indicating that the computer system is to be put into the second shipping position as a part of a computer shutdown process. The voltage may cause the EAPs 203 to expand such that the electronic components 201, 202 are in the undocked shipping position shown in FIG. 2B. When the computer is subsequently powered on, the voltage to the EAPs 203 may be lowered to cause the EAPs to contract from their shipping position to move the electronic components 201, 202 into the operating position shown in FIG. 2C.

Figure 3A:
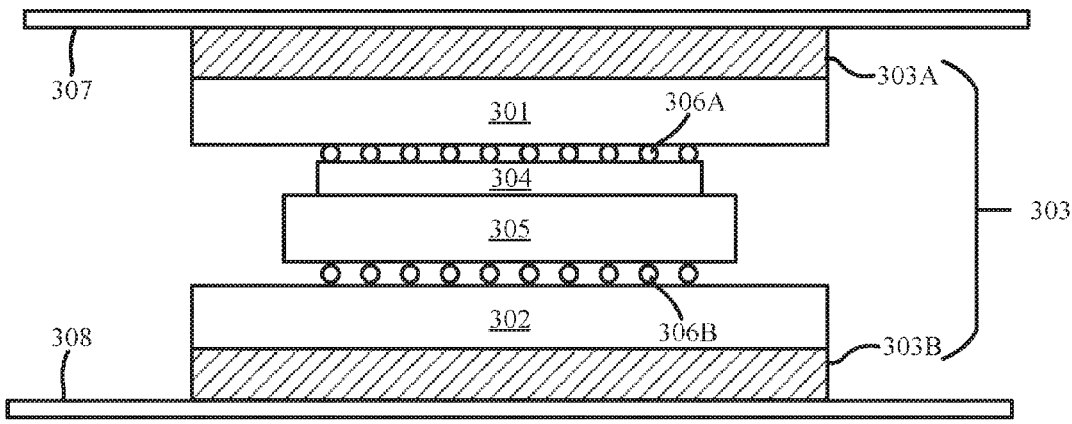
FIGS. 3A-C illustrate a further exemplary pair of electronic components having EAPs to dynamically adjust the position of the electronic components, in accordance with embodiments of the present disclosure.
Figure 3B:
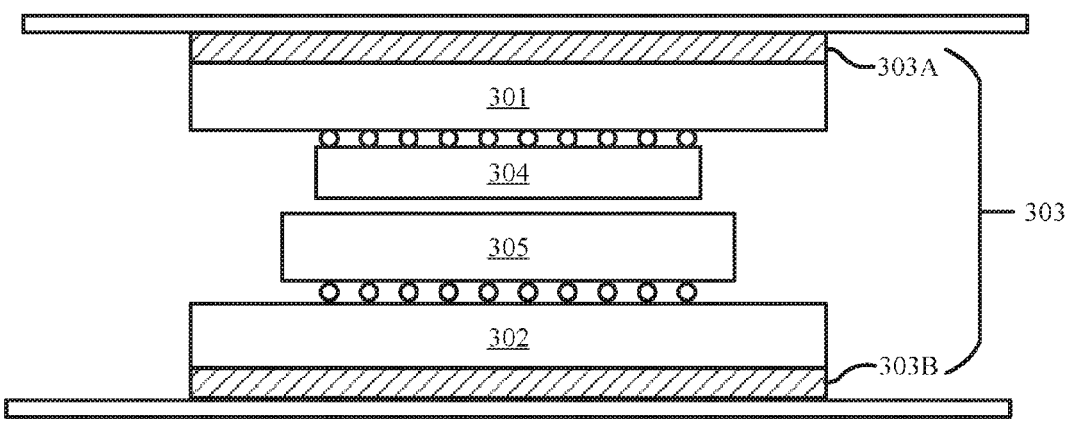
Figure 3C:
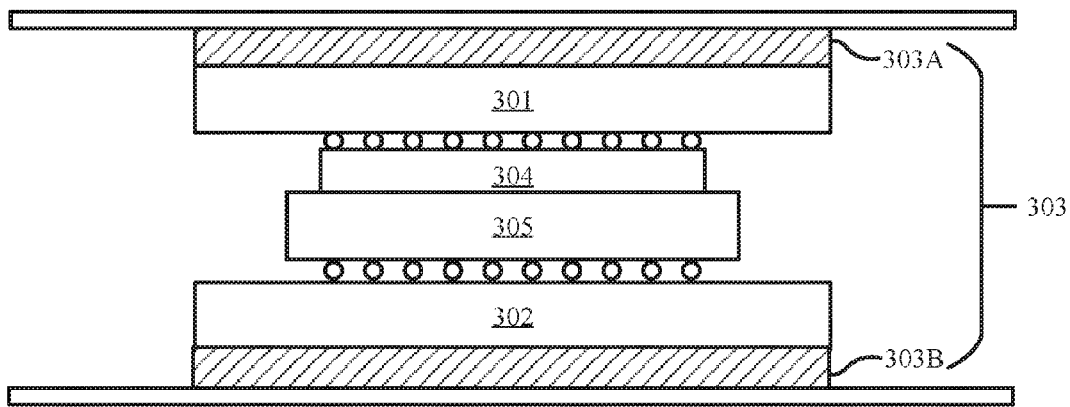

Referring now to FIGS. 3A-C, shown is a further exemplary pair of electronic components having EAPs to dynamically adjust the position of the electronic components, in accordance with embodiments of the present disclosure. FIG. 3A illustrates two electronic components 301, 302 in a shipping position. The first electronic component 301 is coupled with a first connector 304 using a BGA solder joint 306A. The second electronic component 302 is coupled with a second connector 305 using a BGA solder joint 306B. The first connector 304 and the second connector 305 are electrical connectors that are configured for coupling the first electronic component 301 and the second electronic component 302 together. The first and second connectors 304, 305 may be any type of electrical connectors including, but not limited to, VGA connectors, serial port connectors, AGP connectors, PCI connectors, and Molex connectors.

The electronic components 301, 302 may be any type of computer hardware that is configured to be coupled with another electronic component through an electrical connector, such as those discussed in reference to FIG. 1A. While the electronic components 301, 302 are shown as being attached to their respective connectors 304, 305 via BGA joints 306A and 306B, respectively, any other means for attaching the connectors to the electronic components that is otherwise consistent with this disclosure is contemplated, as discussed in reference to FIG. 1A.

The electronic components 301, 302 shown in FIG. 3A are in an over-docked shipping position. In this position, the connectors 304, 305 may be forced together by the EAPs 303A and 303B (collectively referred to as the EAPs 303). Although shown with two EAPs 303 (one attached to each electronic component 301, 302), in some embodiments only one electronic component may have an attached EAP. The load applied to the electronic components 301, 302 by the EAPs 303 may exceed the desired force on the connectors during operation. In some embodiments, the load used to over-dock the electronic components 301, 302 may be sustained throughout the shipping process.

The EAPs 303 may be attached to the electronic components 301, 302, respectively, in order to adjust the height of the electronic components relative to each other. A first EAP 303A may be connected to the top surface of the first electronic component 301 (i.e., to the surface opposite the first connector 304 and the second electronic component 302) and to the bottom surface of a first support mount 307. A second EAP 303B may be connected to the bottom surface of the second electronic component 302 (i.e., to the surface opposite the second connector 305 and the first electronic component 301) and to the top surface of a second support mount 308. The support mounts 307, 308 may be connected to a computer enclosure (not shown). The support mounts 307, 308 may be substantially rigid and may not move significantly, relative to the electronics enclosure, as a result of the EAPs expanding or contracting.

The EAPs 303 may be attached to the electronic components 301, 302 and to the support mounts 307, 308 using any appropriate bonding method including, e.g., an epoxy bond. In some embodiments, the EAPs 303 may be oriented such that their expansion, when a voltage is applied, causes them to move the electronic components 301, 302 towards each other. Likewise, the EAPs 303 may separate the electronic components 301, 302 when the EAPs contract. In other embodiments, the EAPs 303 may contract when a voltage is applied, causing the electronic components 301, 302 to separate. In these embodiments, the EAPs 303 may expand when the voltage is removed, causing the electronic components 301, 302 to engage each other.

FIG. 3B illustrates the two electronic components 301, 302 in a second shipping position. In this shipping position, the electronic components 301, 302 are in an undocked position. A voltage may be removed from the EAPs 303, causing them to contract. The contracting EAPs 303 may cause the first electronic component 301 to become disconnected from the second electronic component 302 by undocking the first and second connectors 304, 305. In some embodiments, only one of the EAPs 303 may be contracted in the undocked shipping position.

FIG. 3C illustrates the two electronic components 301, 302 in an operating position. In the operating position, the electronic components 301, 302 are in a docked, but not over-docked, position. A voltage may be applied to the EAPs 303 such that the EAPs are partially expanded. The amount of expansion of the EAPs 303 may cause the first electronic component 301 to be held at a target height with respect to the second electronic component 302. For the operating position, the target height may cause the connectors 304, 305 to be securely connected such that pins inside the connector make an electrical contact without causing excessive wear or damage to the pins. Accordingly, the operating position may provide superior pin wipe and prevent BGA fatigue (such as BGA creep) when compared to the over-docked position.

Figure 4A:
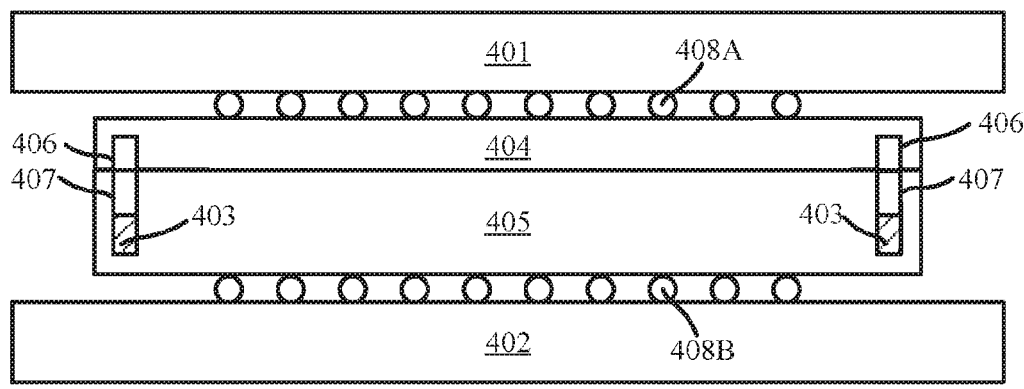
FIGS. 4A-C illustrate an exemplary pair of electronic components having EAPs inside their connector bodies to dynamically adjust the position of the electronic components, in accordance with embodiments of the present disclosure.
Figure 4B:
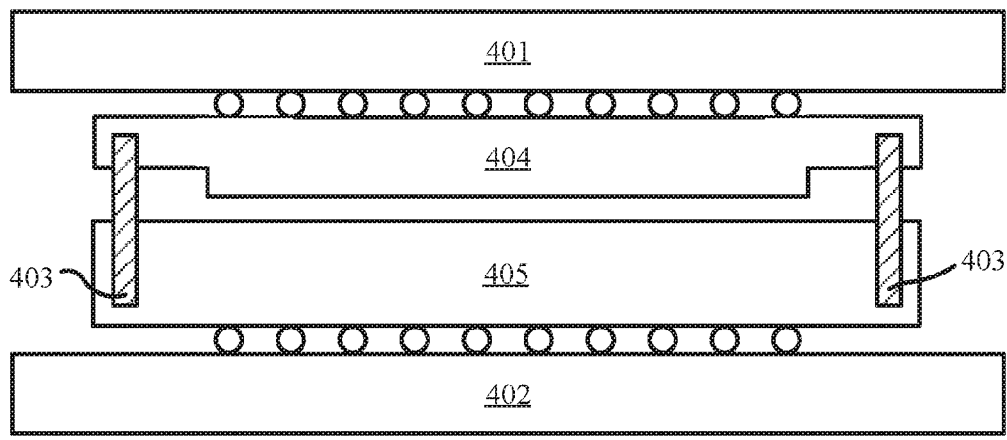
Figure 4C:
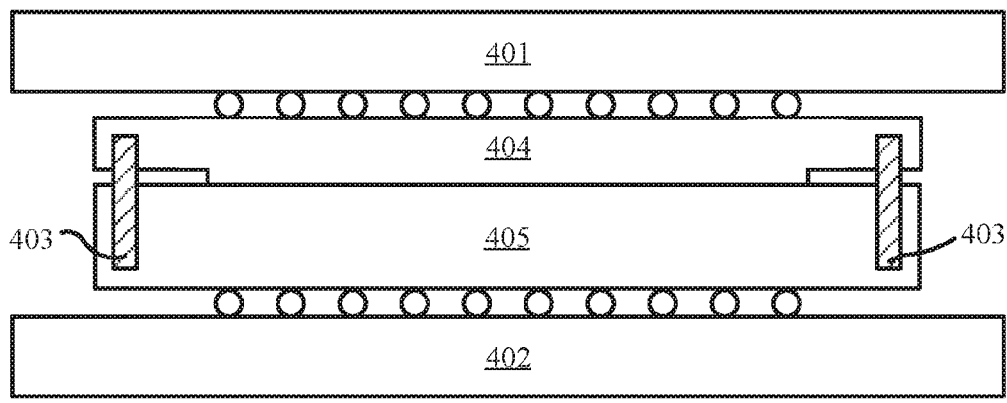

Referring now to FIGS. 4A-C, shown is an exemplary pair of electronic components having EAPs inside their connector bodies to dynamically adjust the position of the electronic components, in accordance with embodiments of the present disclosure. FIG. 4A illustrates two electronic components 401, 402 in a shipping position. The first electronic component 401 is coupled with a first connector 404 using a BGA solder joint 408A. The second electronic component 402 is coupled with a second connector 405 using a BGA solder joint 408B. The first connector 404 and the second connector 405 are electrical connectors that are configured for coupling the first electronic component 401 and the second electronic component 402 together. The first and second connectors 404, 405 may be any type of electrical connectors including, but not limited to, VGA connectors, serial port connectors, AGP connectors, PCI connectors, and Molex connectors.

The electronic components 401, 402 may be any type of computer hardware that is configured to be coupled with another electronic component through an electrical connector, such as those discussed in reference to FIG. 1A. While the electronic components 401, 402 are shown as being attached to their respective connectors 404, 405 via BGA joints 408A and 408B, respectively, any other means for attaching the connectors to the electronic components that is otherwise consistent with this disclosure is contemplated, as discussed in reference to FIG. 1A.

The electronic components 401, 402 shown in FIG. 4A are in an over-docked shipping position. In this position, the connectors 404, 405 may be forced together by a load (e.g., from gravity or mechanical forces) that exceeds the desired force on the connectors during operation of the computer system that includes the electronic components 401, 402. In some embodiments, the load used to over-dock the electronic components 401, 402 may be sustained throughout the shipping process. In other embodiments, the load used to over-dock the electronic components 401, 402 may be applied to initially connect the electronic components and then be removed such that residual stresses are responsible for holding the electronic components in the over-docked position.

The first connector 404 may have a first pair of holes 406. The second connector 405 may have a second pair of holes 407. The second pair of holes 407 may include EAPs 403 inside both holes. The first pair of holes 406 may be aligned with the second pair of holes 407 such that the EAPs 403, when expanded, enter the first pair of holes 406. Once the EAPs 403 have expanded by a certain amount, they will hit the tops of the first pair of holes 406. Further expansion of the EAPs 403 will result in the first and second electronic components 401, 402 separating, eventually becoming disconnected (i.e., undocked). In some embodiments, the EAPs 403 may drive pins into their corresponding holes. In these embodiments, the EAPs 403 may not expand outside of their respective holes. Instead, the pins may contact the tops of the first pair of holes 406 and apply the force required to separate the electronic components 401, 402. The use of pins may be particularly advantageous when the EAPs 403 are made using a material with a low shear strength.

FIG. 4B illustrates the two electronic components 401, 402 in a second shipping position. In this shipping position, the electronic components 401, 402 are in an undocked position. A voltage may be applied to the EAPs 403, causing them to expand. The expanding EAPs 403 may cause the first electronic component 401 to become disconnected from the second electronic component 402 by undocking the first and second connectors 404, 405. In some embodiments, the amount of expansion of the EAPs 403, and therefore the distance between the electronic components 401, 402, may be adjusted by adjusting a voltage that is applied to the EAPs. For example, in some embodiments the electronic components 401, 402 can be separated by a larger amount by applying a greater voltage to the EAPs 403.

FIG. 4C illustrates the two electronic components 401, 402 in an operating position. In the operating position, the electronic components 401, 402 are in a docked, but not over-docked, position. A voltage may be applied to the EAPs 403 such that the EAPs are partially expanded. The amount of expansion of the EAPs 403 may cause the first electronic component 401 to be held at a target height with respect to the second electronic component 402. For the operating position, the target height may cause the connectors 404, 405 to be securely connected such that pins inside the connector make an electrical contact without causing excessive wear or damage to the pins. Accordingly, the operating position may provide superior pin wipe and prevent BGA fatigue (such as BGA creep) when compared to the over-docked position.

Figure 5:
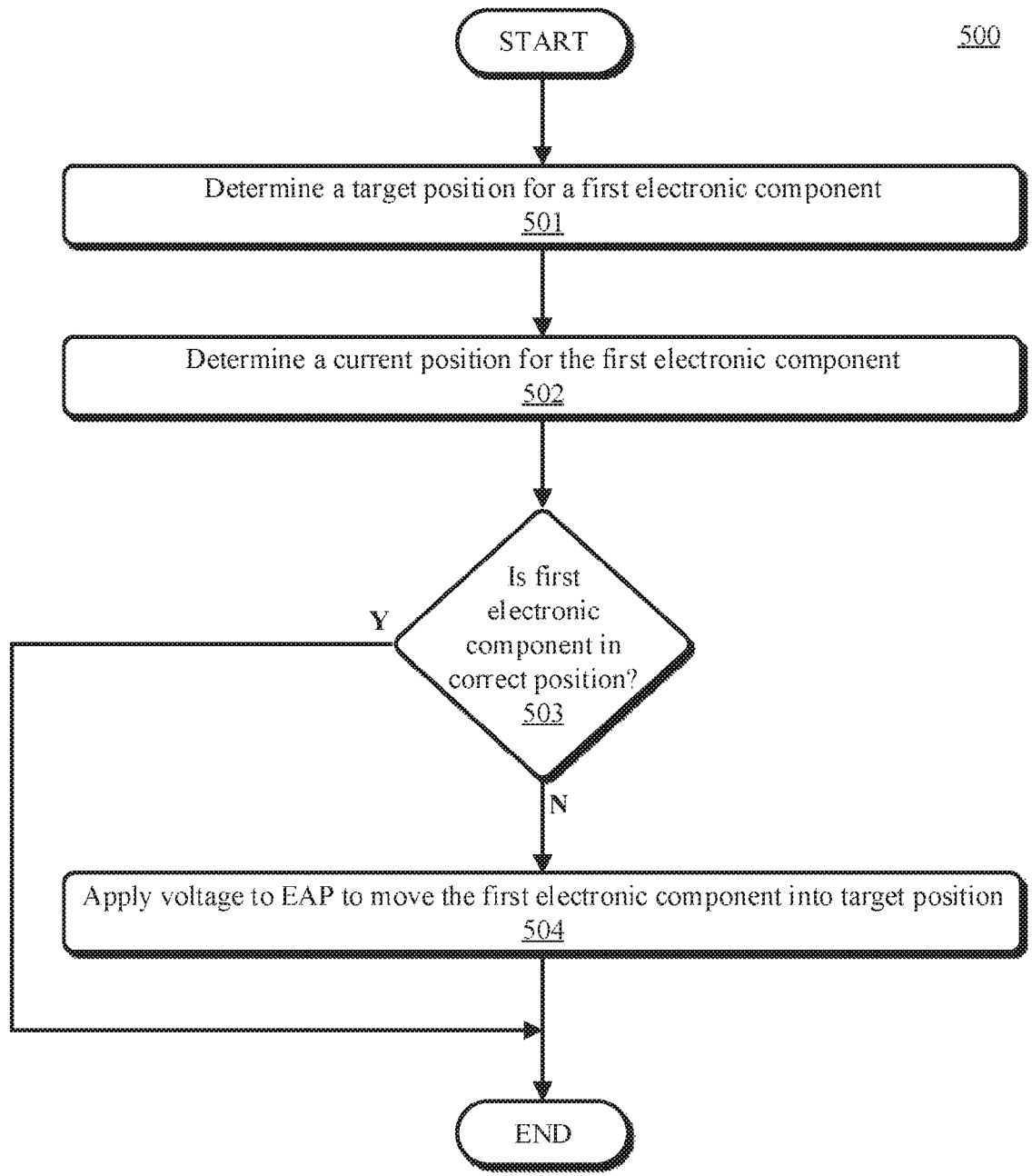
FIG. 5 is a flowchart illustrating a method for dynamically adjusting the position of electronic components, in accordance with embodiments of the present disclosure.

Referring now to FIG. 5, shown is a flowchart illustrating a method 500 for dynamically adjusting the position of electronic components, in accordance with embodiments of the present disclosure. The method 500 may be performed by a computer system that includes the electronic components. The method 500 may begin at operation 501, where the computer system may determine a target position for a first electronic component.

The first electronic component may be configured to be connected to a second electronic component through an electrical connector, such as a Molex connector. Accordingly, the first electronic component may be attached (e.g., through a ball grid array solder joint) to a connector (e.g., a male Molex connector). The second electronic component may have a complementary connector (e.g., a female Molex connector) configured to receive the first electronic component's connector.

At least one of the electronic components may also have one or more EAPs attached to it. The EAPs may be configured to adjust the position of the first electronic component relative to the second electronic component. The EAPs may be attached to the first electronic component using any bonding method appropriate for the materials. For example, in some embodiments the EAPs may be bonded with the first electronic component using an epoxy bonding agent. The EAPs may further be connected to a power source as discussed in reference to FIGS. 1A-C. The EAPs may be positioned on the first electronic component in any manner that allows them to adjust the position of the first electronic component. For example, the EAPs may be positioned on the first electronic component as discussed in reference to any of the previous figures (e.g., FIG. 2A). In some embodiments, such as those discussed in reference to FIGS. 4A-C, the EAPs may reside inside, or as a part of, the connector instead of attached separately to the first electronic component.

In some embodiments, predetermined voltages may be established for the EAPs. The predetermined voltages may correspond to different target positions. For example, a first predetermined voltage may correspond to the over-docked shipping position (e.g., cause the EAPs to move the electronic components into the over-docked position shown in FIG. 1A). A second predetermined voltage may correspond to the undocked shipping position (e.g., as shown in FIG. 1B), and a third predetermined voltage may correspond to an operating position (e.g., the position shown in FIG. 1C). The computer system (or a user) may select the predetermined voltage corresponding to the target position.

In some embodiments, the target position for the electronic component may correspond to a desired use of the computer system. For example, if the computer system is to be powered on and operated, the target position of the electronic component may be an operating position (e.g., the position shown in FIG. 1C). As another example, if the computer system is going to be shipped, the target position of the electronic component may be in a shipping position (e.g., the positions shown in FIG. 1A and FIG. 1B).

In some embodiments, the target position is determined in accordance with a user's input. For example, a user's input may indicate that the computer system should be in a shipping position. Accordingly, the computer system may determine that the target position for the first electronic component is either an over-docked shipping position (such as the one shown in, e.g., FIG. 1A), or an undocked shipping position (such as the one shown in, e.g., FIG. 1B). In some embodiments, the user may select the exact target shipping position. In some embodiments, the user may input a target voltage to be applied to the EAPs instead of selecting from predetermined positions or voltages.

In other embodiments, the computer system may automatically determine the target position of the first electronic component based on, e.g., the state of the computer. For example, if the computer is powered on, the computer system may determine that the first electronic component needs to be "plugged in" (e.g., connected) to another electronic component (e.g., the second electronic component) for the system to operate properly. Accordingly, the computer system may determine that the target position is when the first electronic component is docked, but not over-docked, with a corresponding electronic component (e.g., the electronic component may be in the operating position shown in FIG. 2C).

After determining the target position for the first electronic component at operation 501, the computer system may determine the current position of the first electronic component at operation 502. In some embodiments, the computer system may determine the current position of the first electronic component by determining the voltage applied to the EAPs. The computer system may compare the voltage being applied to the EAPs to a set of predetermined voltages, each predetermined voltage having an associated position. Based on the comparison, the computer system may determine the current position of the electronic component.

After determining the current position of the first electronic component at operation 502, the computer system may determine whether the first electronic component is in the correct position at decision block 503. The computer system may compare the target position to the current position to determine whether the first electronic component is in the correct position. If the first electronic component is in the correct position, the method 500 may end.

If the first electronic component is not in the correct position, the computer system may adjust the voltage applied to the EAPs to move the first electronic component into the correct position (e.g., the target position) at operation 504. The selected voltage (e.g., the voltage corresponding with the target position) may be applied to the EAPs to cause the first electronic component to move into the target position.

While the figures and the detailed description describe the first electronic component as having three positions (e.g., an over-docked shipping position, an undocked shipping position, and an operating position), any number of positions is contemplated. For example, the computer system may only have one defined shipping position instead of two. As another example, there may be other shipping or operating positions in addition to those shown in the figures.

Figure 6:
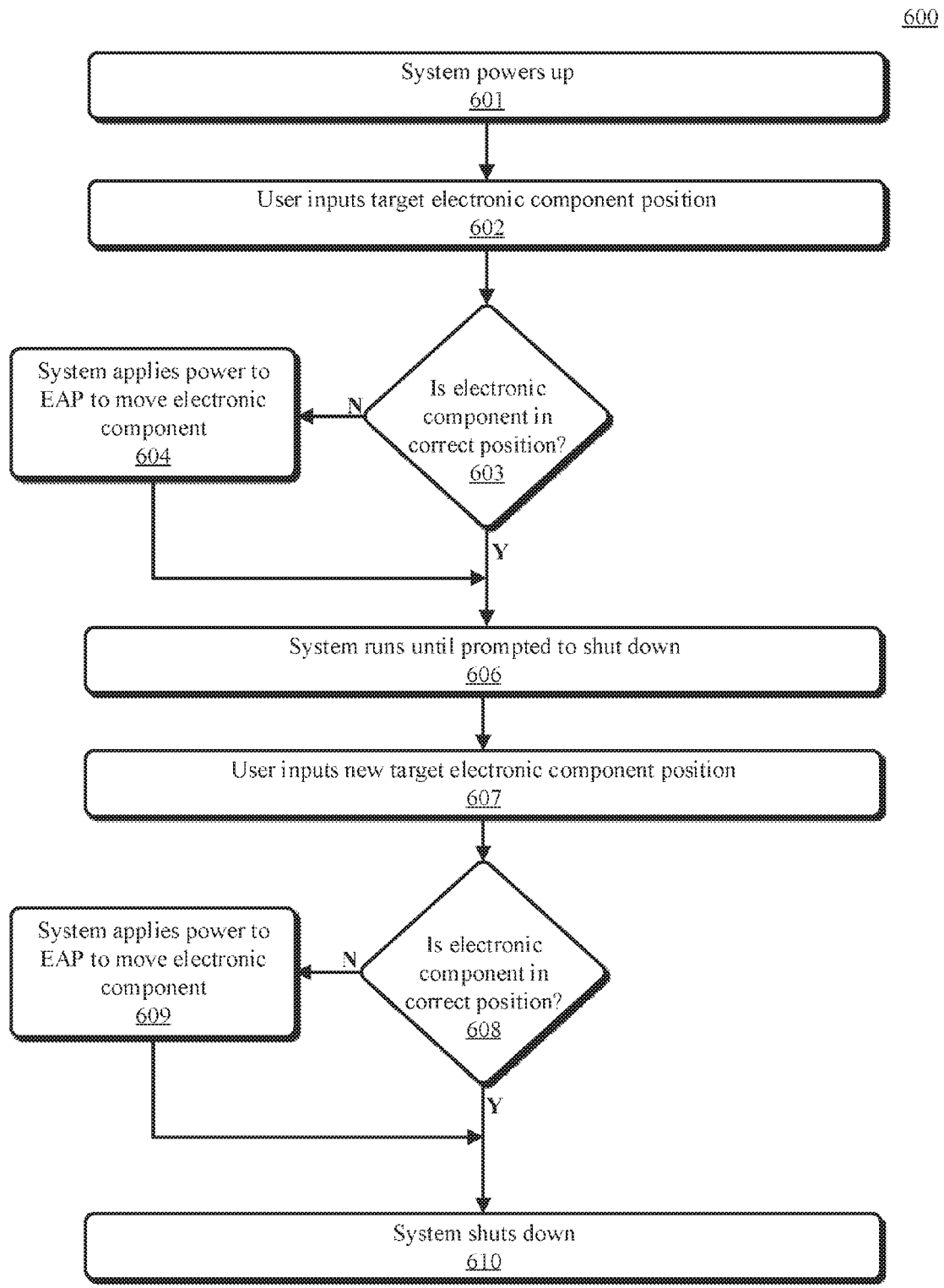
FIG. 6 is a flowchart illustrating an exemplary operation of a computer system, in accordance with embodiments of the present disclosure.

Referring now to FIG. 6, shown is a flowchart illustrating an exemplary operation 600 of a computer system, in accordance with embodiments of the present disclosure. The method 600 may be performed by a computer system with input from a user. The method 600 may begin at operation 601, where the computer system is turned on.

At operation 602, the user may input the target position of the electronic component. The user may input the target position as discussed in reference to FIG. 5. For example, in some embodiments the user may select from one or more predetermined positions (e.g., over-docked shipping position or operating position). In other embodiments, the user may input a target voltage that should be applied to the EAPs.

After the user inputs a target position of the electronic component at operation 602, the computer system may determine whether the electronic component is in the correct position (e.g., the target position) at decision block 603. The computer system may compare the current position of the electronic component to the target position as discussed more thoroughly in reference to FIG. 5. For example, the computer system may compare the current voltage being applied to the EAPs to the voltage associated with the target position. If the electronic component is in the correct position, the method 600 may progress to operation 606.

If, however, the electronic component is not in the correct position, the method 600 may progress to operation 604, where the computer system may apply a voltage to the EAPs. The applied voltage may correspond to the target position.

After the computer system applies the voltage to the EAPs, causing the electronic component to move into the target position, the system may run until prompted to shut down at operation 606.

After the computer system is prompted to shut down at operation 606, the user may input a new target position for the electronic component at operation 607. The user may input the new target position as discussed in reference to FIG. 5. In some embodiments, the user may select from one or more predetermined positions (e.g., over-docked shipping position or operating position). For example, if the computer system is being shipped to a recipient, the user may select a shipping position during the shutdown procedure. If, however, the computer system is not going to be shipped, the user may select the operating position during the shutdown procedure. In some embodiments, the user may input a target voltage that should be applied to the EAPs instead of selecting from a list of predetermined positions.

After the user inputs a new target position of the electronic component at operation 607, the computer system may determine whether the electronic component is in the correct position (e.g., the new target position) at decision block 608. The computer system may compare the current position of the electronic component to the new target position as discussed more thoroughly in reference to FIG. 5. For example, the computer system may compare the current voltage being applied to the EAPs to the voltage corresponding to the new target position. If the electronic component is in the correct position, the computer system may complete the shutdown process at operation 610 and the method 600 may end.

If, however, the electronic component is not in the correct position, the computer system may apply a voltage to the EAPs to move the electronic component into the new target position at operation 609. After the computer system applies the voltage to the EAPs, causing the electronic component to move into the new target position, the system may complete the shutdown process at operation 610 and the method 600 may end.

Figure 7:
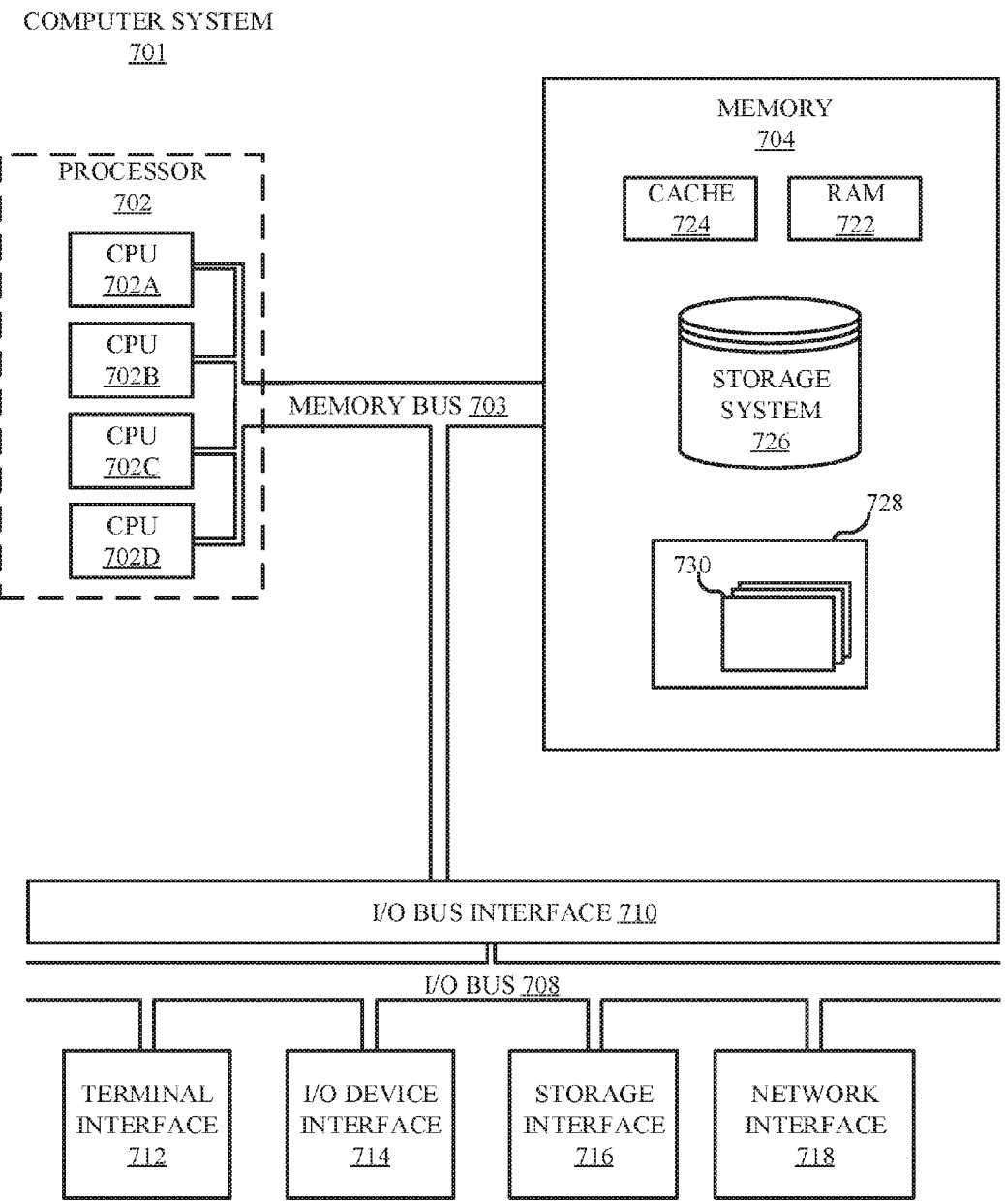
FIG. 7 illustrates a high-level block diagram of an example computer system that may be used in implementing one or more of the methods, tools, and modules, and any related functions, described herein, in accordance with embodiments of the present disclosure.

Referring now to FIG. 7, shown is a high-level block diagram of an example computer system 701 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 701 may comprise one or more CPUs 702, a memory subsystem 704, a terminal interface 712, a storage interface 716, an I/O (Input/Output) device interface 714, and a network interface 718, all of which may be communicatively coupled, directly or indirectly, for inter-component communication via a memory bus 703, an I/O bus 708, and an I/O bus interface unit 710.

The computer system 701 may contain one or more general-purpose programmable central processing units (CPUs) 702A, 702B, 702C, and 702D, herein generically referred to as the CPU 702. In some embodiments, the computer system 701 may contain multiple processors typical of a relatively large system; however, in other embodiments the computer system 701 may alternatively be a single CPU system. Each CPU 702 may execute instructions stored in the memory subsystem 704 and may include one or more levels of on-board cache.

System memory 704 may include computer system readable media in the form of volatile memory, such as random access memory (RAM) 722 or cache memory 724. Computer system 701 may further include other removable/non-removable, volatile/non-volatile computer system storage media.

By way of example only, storage system 726 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 704 can include flash memory, e.g., a flash memory stick drive or a flash drive. Memory devices can be connected to memory bus 703 by one or more data media interfaces. The memory 704 may include at least one program product having a set (e.g., at least one) of program modules that are configured to carry out the functions of various embodiments.

One or more programs/utilities 728, each having at least one set of program modules 730 may be stored in memory 704. The programs/utilities 728 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 730 generally perform the functions or methodologies of various embodiments.

For example, in an embodiment of the present disclosure, the program modules 730 may include a component position module and a voltage regulator module. The component position module may include instructions to receive, from a user, a target position for one or more electronic components. The component position module may include further instructions to determine a current position of the electronic component (also referred to herein as the current position of the electronic component). The component position module may also include instructions to automatically determine a target position of the electronic component. The automatically determined target position may be based on, e.g., the state of the computer (e.g., powered on). After identifying the actual and target positions of the electronic component, the component position module may provide the actual and target positions to the voltage regulator module.

The voltage regulator module may include instructions to monitor and, when necessary, adjust the voltage applied to EAPs. The voltage regulator module may include instructions to determine, based on the target position identified by the component position module, an appropriate voltage to apply to the EAPs to move the electronic component into the target position. The voltage regulator module may include instructions to compare the target position to one or more predetermined positions. Each predetermined position may have an associated predetermined voltage that, when applied to the EAPs, causes the electronic component to move into the predetermined position. The voltage regulator module may determine which predetermined position matches the target position. The voltage regulator module may include further instructions to apply the appropriate voltage to the EAPs (e.g., apply the voltage associated with the predetermined position that matches the target position).

Although the memory bus 703 is shown in FIG. 7 as a single bus structure providing a direct communication path among the CPUs 702, the memory subsystem 704, and the I/O bus interface 710, the memory bus 703 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 710 and the I/O bus 708 are shown as single respective units, the computer system 701 may, in some embodiments, contain multiple I/O bus interface units 710, multiple I/O buses 708, or both. Further, while multiple I/O interface units are shown, which separate the I/O bus 708 from various communications paths running to the various I/O devices, in other embodiments some or all of the I/O devices may be connected directly to one or more system I/O buses.

In some embodiments, the computer system 701 may be a multi-user mainframe computer system, a single-user system, or a server computer or similar device that has little or no direct user interface, but receives requests from other computer systems (clients). Further, in some embodiments, the computer system 701 may be implemented as a desktop computer, portable computer, laptop or notebook computer, tablet computer, pocket computer, telephone, smart phone, network switches or routers, or any other appropriate type of electronic device.

It is noted that FIG. 7 is intended to depict the representative major components of an exemplary computer system 701. In some embodiments, however, individual components may have greater or lesser complexity than as represented in FIG. 7, components other than or in addition to those shown in FIG. 7 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A computer implemented method for adjusting a position of an electronic component, the method comprising:
    establishing, by a processor in a computer system, one or more predetermined positions for a first electronic component in the computer system, the first electronic component having a first electrical connector, the first electronic component being configured to connect with a second electronic component in the computer system, the second electronic component having a second electrical connector;
    prompting, by the processor, a user to select a target position for the first electronic component from the one or more predetermined positions;
    receiving, from the user, an input, wherein the input identifies the target position, the input being selected from the one or more predetermined positions;
    determining, by the processor, a voltage being applied to an electroactive polymer (EAP), the EAP being located on the first electronic component;
    comparing, by the processor, the voltage to one or more predetermined voltages, each of the one or more predetermined voltages corresponding to one of the one or more predetermined positions, each predetermined voltage being a voltage that causes the EAP to move the first electronic component into the corresponding predetermined position;
    determining, based on the comparing, a current position of the first electronic component, the current position being the predetermined position that corresponds to the voltage being applied to the EAP;
    determining whether the first electronic component is in the target position by comparing the current position to the target position; and
    adjusting, in response to determining that the first electronic component is not in the target position, the position of the first electronic component, wherein the adjusting includes using the EAP to move the first electronic component into the target position.

* * * * *